(12) United States Patent
Seki (10) Patent No.: US 7,805,654 B2
(45) Date of Patent: *Sep. 28, 2010

(54) DECODING DEVICE AND DECODING METHOD AND PROGRAM

(75) Inventor: Katsutoshi Seki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 1106 days.

This patent is subject to a terminal disclaimer.

(21) Appl. No.: 11/476,679

(22) Filed: Jun. 29, 2006

(65) Prior Publication Data

US 2007/0033481 A1    Feb. 8, 2007

(30) Foreign Application Priority Data

Jun. 30, 2005    (JP)    ............................. 2005-191153

(51) Int. Cl.
   *H03M 13/00*    (2006.01)
(52) U.S. Cl. ...................................... 714/755; 714/786
(58) Field of Classification Search ................. 714/755, 714/786

See application file for complete search history.

(56) References Cited

U.S. PATENT DOCUMENTS

| 7,373,581 | B2 | 5/2008 | Okamura et al. | |
| 2004/0185886 | A1 | 9/2004 | Matsumoto | |
| 2005/0138516 | A1* | 6/2005 | Yedidia | ...................... 714/746 |
| 2005/0268204 | A1 | 12/2005 | Hirada | |
| 2007/0033482 | A1 | 2/2007 | Seki | |
| 2007/0113163 | A1* | 5/2007 | Golitschek Edler Von Elbwart et al. | ............................... 714/801 |
| 2008/0246639 | A1 | 10/2008 | Sakai et al. | |

FOREIGN PATENT DOCUMENTS

| JP | 2003-244109 | 8/2003 |
| JP | 2004-186940 (A) | 7/2004 |
| JP | 2005-347883 (A) | 12/2005 |
| JP | 2007-13518 (A) | 1/2007 |
| WOWO | 2006/059688 (A1) | 6/2006 |
| WOWO | 2006/120844 (A1) | 11/2006 |

OTHER PUBLICATIONS

D. Mackay, "Good Error-Correcting Codes Based on Very Sparse Matrices," IEEE Transactions on Information Theory, vol. 45:2, Mar. 1999, pp. 399-431.
E. Yeo et al., "High Throughput Low-Density Parity-Check Decoder Architectures," Global Telecommunications Conference 2001, vol. 5, 25-29, Nov. 2001, pp. 3019-3024.
Yoshihiro Kurihara et al. Performance Evaluation of Ordered Sum-Product Algorithm, The Institute of Electronics, Information And Communication Engineers Research Report, Mar. 9, 2004, pp. 13-18.

* cited by examiner

*Primary Examiner*—Guy J Lamarre
(74) *Attorney, Agent, or Firm*—Foley & Lardner LLP (57) ABSTRACT

To provide an LDPC decoder, to which SPA is applied, and a method wherein decoding characteristics are improved by reducing the ratio of a message from a check node within messages sent to the same check node. In a decoding device that decodes a received LDPC code by repeating the passing of messages between a plurality of check nodes and a plurality of bit nodes corresponding to a check matrix in each iteration, the order of message computation at a cluster in an iteration out of at least two iterations that have a before-and-after relationship in time and the order of message computation at a cluster in another iteration are varied.

24 Claims, 8 Drawing Sheets

DECODING DEVICE AND DECODING METHOD AND PROGRAM

FIELD OF THE INVENTION

The present invention relates to a decoding technology and to a device, a method, and a program suitable for decoding Low Density Parity Check Codes (LDPC hereinafter).

BACKGROUND OF THE INVENTION

In recent years, error correction technology has been widely used in wireless, cable, and recording systems. The combination of low density parity check codes (LDPC) and its decoding method, the sum-product algorithm (SPA hereinafter) has very good decoding characteristics and is expected to be an excellent error correction code for the next generation. At the sending side, an encoder generates a check matrix H, which is later described, and a generator matrix G (k×n matrix; k: Information length, n: code word length) is derived (where $GH^T=0$ (T denotes transposition matrix). The encoder then receives a message $(m_1, m_2 \ldots, m_k)$ of an information length k, generates a code word $(c_1, c_2, \ldots, c_n)$ from $(m_1, m_2, \ldots, m_k)$ G using the generator matrix G (where $(c_1, c_2, \ldots, c_n)H^T=0$), and modulates and sends the generated code word. A decoder receives the modulated signal via a channel and demodulates it. The decoder then subjects the demodulated result to an iterative decoding by SPA and provides an estimated result (corresponding to the original $(m_1, m_2, \ldots, m_k)$). (Refer to Patent Document 1.) The gist of LDPC code and SPA decoding will be described.

LDPC code is a linear code defined by a sparse check matrix. The check matrix of an LDPC code can be expressed by a bipartite graph called the Turner graph. Let's assume that a check matrix H, which is an M×N matrix, is given. Nodes that constitute the Turner graph are constituted by N bit nodes and M check nodes. The bit nodes and the check nodes correspond to the column and row of the check matrix H respectively, and when the elements in row i and column j of the check matrix are 1, the $j^{th}$ bit node and the $i^{th}$ check node are connected.

Figure 5:
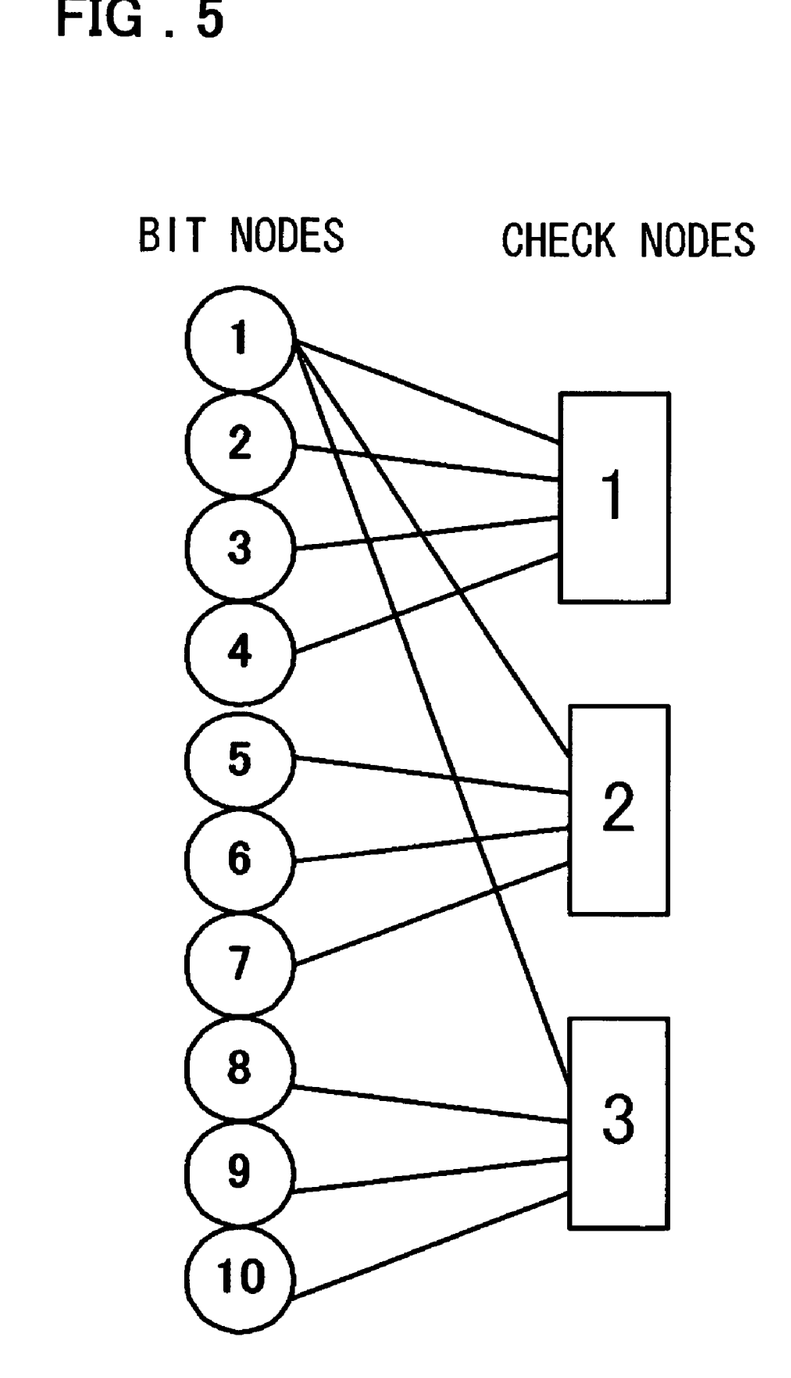
FIG. 5 is an example of a Turner graph.

For instance, when the check matrix H is as given by an equation (1), the Turner graph is as shown in FIG. 5.

$$H = \begin{bmatrix} 1111000000 \\ 1000111000 \\ 1000000111 \end{bmatrix} \quad (1)$$

Each bit node represents the received bit (each symbol of the code word) and each check node represents a parity check constraint (condition) among the bit nodes (the symbols) to which it is connected. In the aforementioned check matrix H, for a message of code word length 10 $(m_1, \ldots, m_{10})$, a check node 1 corresponds to $m_1+m_2+m_3+m_4=0$, a check node 2 to $m_1+m_5+m_6+m_7=0$, and a check node 3 to $m_1+m_8+m_9+m_{10}=0$, as the parity check condition.

In SPA, decoding is performed by sending/receiving messages on a Turner graph constituted by a check matrix defining an LDPC code. A round of message passing between connected bit node and check node is called one iteration.

In order to obtain good decoding characteristics, multiple iterations are needed. A message $Q_{nm}$ from a bit node n to a check node m out of messages that are passed between the nodes is given by an equation (2). Further, a message $R_{mn}$ from the check node m to the bit node n is given by an equation (3). Note that an estimate for the received bit is provided according to a computation result code of the message $Q_{nm}$ at the bit node after multiple iterations (depending on whether the code is positive or negative, 0 or 1).

$$Q_{nm} = \ln\left[\frac{p_n(1)}{p_n(0)}\right] + \left(\sum_{m' \in \mu(n)} R_{m'n}\right) - R_{mn} \quad (2)$$

Note that $\mu(n)$ of m'∈$\mu(n)$ in ($\Sigma R_{m'n}$), the summing operation of $R_{m'n}$ about m', in the equation (2) represents a set of check nodes adjacent to the bit node n. In other words, it is a set of row numbers obtaining 1 in an $n^{th}$ column of the check matrix H, and in the case of the check matrix H of the equation (1), $\mu(1)=\{1,2,3\}$, and $\mu(2)=\{1\}$.

Further, in the equation (2), $\ln[p_n(1)/p_n(0)]$ is an input LLR (Log Likelihood Ratio). Note that $\ln[pn(1)/pn(0)]$ represents the same thing as $(\ln[P(yn|xn=0)/P(yn|xn=1)])$, which is described later.

$$R_{mn} = \Phi^{-1}\left\{\Phi\left(\sum_{n' \in v(m)} Q_{n'm}\right) - \Phi(Q_{nm})\right\} * \quad (3)$$

$$\left(\text{sign}(Q_{nm}) * \prod_{n' \in v(m)} \text{sign}(Q_{n'm})\right)$$

where:

$$\Phi(x) = -\log\left(\tanh\left(\frac{1}{2}x\right)\right) \quad (4)$$

($\Sigma Q_{n'm}$), the summing operation of $Q_{n'm}$ about n', and v(m) of n'∈v(m) in $\Pi$ sign($Q_{n'm}$), the product operation of sign ($Q_{n'm}$), in the equation (3) represent a set of bit nodes adjacent (connected) to the check node m. In other words, it is a set of column numbers obtaining 1 in an $m^{th}$ row of the check matrix H of the equation (1), and in the case of the check matrix H of the equation (1), v(1)={1,2,3,4}.

When an LDPC decoder is realized, the check nodes are conventionally divided into a plurality of groups and message computations are pipeline-processed. This group division is called "clustering" and the order of computation is called "scheduling."

Figure 6:
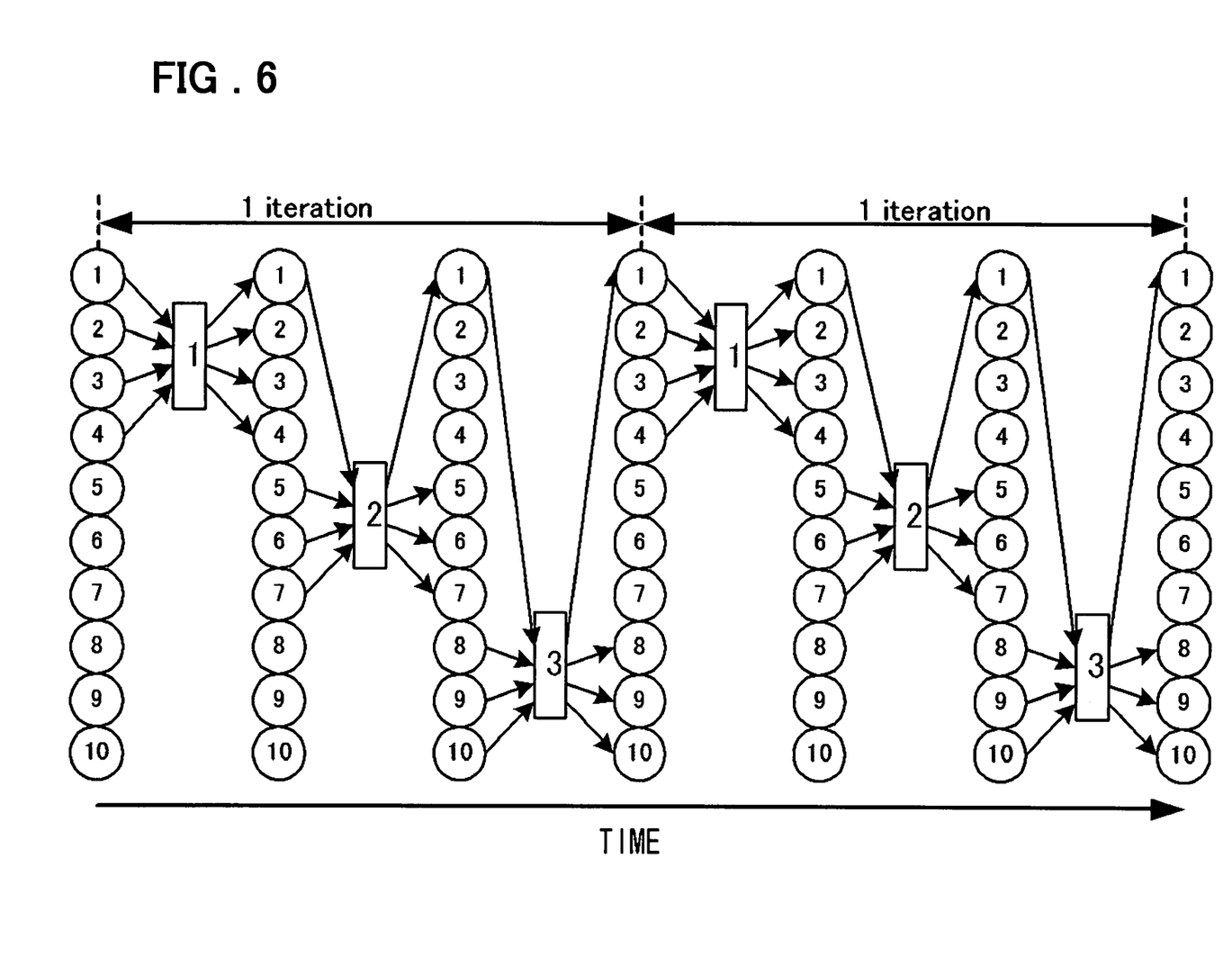
FIG. 6 is a drawing illustrating how messages are passed when the cluster size is 1.

FIG. 6 is a drawing showing how messages are passed when the LDPC code defined by the equation (1) is decoded in cluster size 1 (1 check node per cluster). In FIG. 6, how messages are passed between the bit nodes and the check nodes in the case of the Turner graph shown in FIG. 5 (cluster size 1) is shown. In FIG. 6, the bit nodes are indicated by the circled numbers (indicating each bit node number), the check nodes by the boxed numbers (indicating each check node number), and the arrows from the nodes indicate the passing of messages as in FIG. 5.

Messages $Q_{11}, Q_{21}, Q_{31}$, and $Q_{41}$ are sent from bit nodes 1, 2, 3, and 4 to the check node 1, and the check node 1 sends messages $R_{11}, R_{12}, R_{13}$, and $R_{14}$ to the bit nodes 1, 2, 3, and 4 respectively. Next, messages $Q_{12}, Q_{52}, Q_{62}$, and $Q_{72}$ are sent from the bit nodes 1, 5, 6, and 7 to the check node 2, and the check node 2 sends messages $R_{21}, R_{25}, R_{26}$, and $R_{27}$ to the bit nodes 1, 5, 6, and 7 respectively. Then, messages $Q_{13}, Q_{83}, Q_{93}$, and $Q_{103}$ are sent from the bit nodes 1, 8, 9, and 10 to the check node 3, and the check node 3 sends messages $R_{31}, R_{38}$, $R_{39}$, and $R_{310}$ to the bit nodes 1, 8, 9, and 10 respectively. The sequence of message passing described above constitutes one iteration.

The Turner graph in FIG. 5 does not include any loop. Here, loop means a circulating path that starts from a node.

When a Turner graph does not include any loop, SPA can compute accurate posterior probability.

Figure 7:
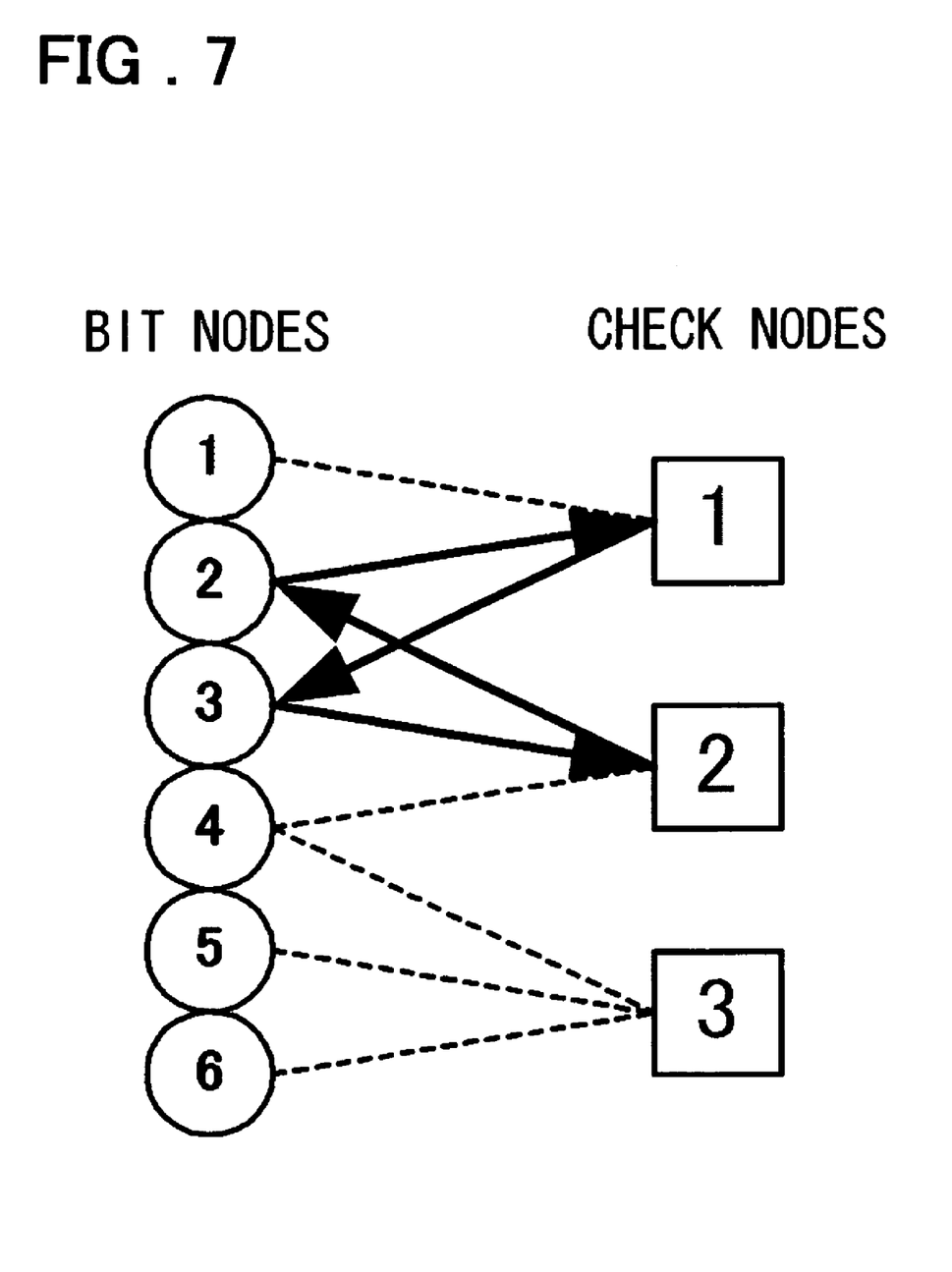
FIG. 7 is a Turner graph having a loop.

On the other hand, a Turner graph defined by a check matrix H of an equation (5) includes a loop of length 4 as shown in FIG. 7. In FIG. 7, arrows indicate the direction of each message passed between nodes.

$$H = \begin{bmatrix} 111000 \\ 011100 \\ 000111 \end{bmatrix} \quad (5)$$

In other words, as shown in FIG. 7, the path of the loop of length 4 is from a check node 1 to a bit node 3, from the bit node 3 to a check node 2, from the check node 2 to a bit node 2, and from the bit node 2 to the check node 1.

When a message goes around as above, accurate posterior probability cannot be computed by the decoder, resulting in deteriorated decoding characteristics. It is known that the shorter the loop is, the worse decoding characteristics become (Non-Patent Document 1).

When an LDPC decoder is realized, a majority of the chip area is occupied by a register or memory for holding messages and interconnect paths for sending/receiving messages.

Accordingly, a method for reducing the number of messages by approximating the equation (2) by an equation (6) has been proposed (Non-Patent Document 2).

$$Q'_n(k) = Q'_n(k-1) + \sum_{m' \in \{S(k) \cap \mu(n)\}} R_{m'n} \quad (6)$$

In the equation (6), $R_{mn}$ refers to messages from the check node m to the bit node n and can be given by the equation (3).

Further, $S(k)$ of $m' \in \{S(k) \cap \mu(n)\}$ in ($\in R_{m'n}$), the summing operation of $R_{m'n}$ about m', is a set of check nodes included in the cluster being computed at a time k, $\mu(n)$ is a set of check nodes adjacent to the bit node n, and $\cap$ represents AND. Therefore, in the summing operation of $R_{m'n}$ about m', the messages $R_{m'n}$ from a check node m' that is included in both $S(k)$ and $\mu(n)$ are summed, $Q_n(k-1)$ at a previous time k-1 is added to the summed result, and $Q'_n(k)$, the message at the time k, is the result of this addition. The bit node n passes the same message $Q'_n(k)$ to the check nodes connected to the bit node n.

In the message computation process at the bit nodes, the messages $R_{mn}$ from the check node m to the bit node n are computed for each cluster, and the computation results are added to $Q'_n$.

The initial value $Q'_n(0)$ of $Q'_n(k)$ is the input (channel) LLR. LLR stands for Log Likelihood Ratio ($\ln[P(y_n|x_n=0)/P(y_n|x_n=1)]$). Note that $y_i$ is the received symbol, $x_i$ is the transmitted symbol, $n_i$ is an additive white Gaussian channel ($y_i=x_i+n_i$) for white Gaussian noise, and binary-bipolar conversion ($0 \to +1$, $1 \to -1$) is executed.

As a result of having the equation (6) approximate the equation (2), one bit node sends the same message to all the adjacent check nodes (all the check nodes connected to the bit node). Therefore, resources such as registers for holding messages and interconnect paths can be greatly reduced.

Further, as a result of having the equation (6) approximate the equation (2), the amount of message computations can be reduced by 50 percent or more, compared to the equation (2). In other words, the computation speed and processing performance are improved.

[Patent Document 1]
Japanese Patent Kokai Publication No. JP-P2003-244109A

[Non-Patent Document 1]
D. J. C. MacKay, "Good error-correcting codes based on very sparse matrices," IEEE Transactions on Information Theory, vol. 45, pp. 399-431 (1999).

[Non-Patent Document 2]
Yeo, E.; Pakzad, P.; Nikolic, B.; Anantharam, V., "High throughput low-density parity-check decoder architectures," Global Telecommunications Conference 2001, Volume: 5, 25-29 Nov. 2001, pp. 3019-3024.

SUMMARY OF THE DISCLOSURE

As mentioned above, by having the equation (6) approximate the equation (2), the amount of message computations is greatly reduced, compared with the equation (2). However, there are problems as described below. The investigation of these problems is a result of research performed by the present inventor.

In the approximation by the equation (6), the messages $R_{mn}$ that the check node m sends to the bit node n are sent back to the check node m even when no loop exists in the Turner graph. In this case, as in a situation in which a short loop exists, posterior probability cannot be computed accurately, resulting in the deterioration of the error correction performance.

For instance, in the case of the Turner graph in FIG. 5, in the computation of $Q_{nm}$ in the equation (2), $\mu(1) = \{1, 2, 3\}$. The summing operation of $\Sigma R_{m'n}$ in the computation of the message $Q_{11}$ from the bit node 1 to the check node 1 is performed on $m' \in \mu(1)$, therefore $\Sigma R_{m'n} = R_{11} + R_{21} + R_{31}$. $R_{11}$ is subtracted from the total sum ($R_{11} + R_{21} + R_{31}$) in the equation (2), therefore resulting in $R_{21} + R_{31}$.

On the other hand, in the case of the approximation by the equation (6), the summing operation of $\Sigma R_{m'n}$ with $Q'_1(k)$ is $R_{11} + R_{21} + R_{31}$, and $Q'_n(k)$ is passed from the bit node 1 to the check nodes 1, 2, and 3. $R_{11}$ is included in the messages received by the check node 1 and the situation is essentially equivalent to the case where a short loop exists.

Figure 8A:
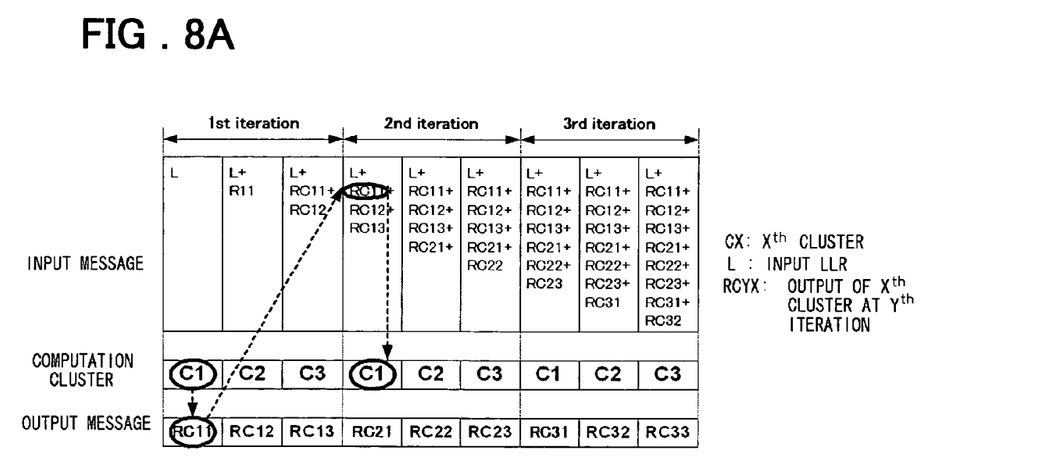
FIGS. 8A and 8B are timing charts time-sequentially showing messages passed between bit nodes and clusters.
Figure 8B:
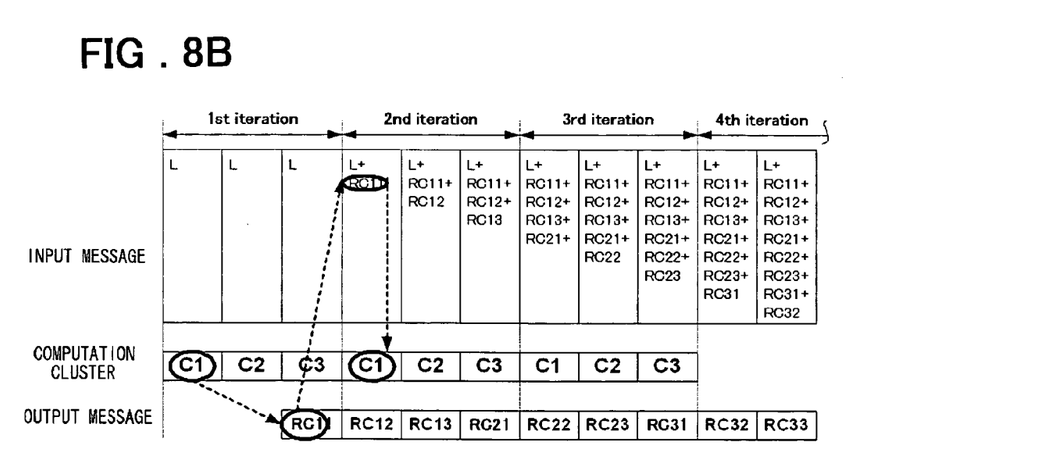

FIGS. 8A and 8B are drawings illustrating the operation timing of message computations. FIG. 8A is a drawing illustrating the operation timing when there is no delay in message computation at the check nodes, and FIG. 8B is a drawing illustrating the operation timing when there is a processing delay of 2 clock cycles in message computation at the check nodes.

In FIGS. 8A and 8B, input message is the input message from the bit node 1 to each check node in FIGS. 5 and 6. Computation clusters C1, C2, and C3 represent first, second, and third clusters, and output message represents the message outputted by the corresponding cluster. Note that, in FIGS. 5, 6, 8A and 8B, one cluster equals one check node. The check node 1 is grouped as the first cluster (C1), the check node 2 as the second cluster (C2), and the check node 3 as the third cluster (C3). In other words, the first, second, and third clusters are the check nodes 1, 2, and 3 respectively in FIGS. 5, 6, 8A and 8B. "RCYX" in the drawing represents the output of an $X^{th}$ cluster in a $Y^{th}$ iteration. "L" in the input message is the value of the input LLR.

When the approximation by the equation (6) is employed, a message sent by a check node is passed back to the original check node even if no loop exists in the Turner graph. For instance, an output RC11 of the first cluster C1 in a first iteration (the output of the first cluster in the first iteration and its content is a message $R_{11}$ from the check node 1 to the bit node 1) is passed back to the first cluster C1 (the check node 1) in the ensuing second iteration (refer to FIGS. 8A and 8B).

As a result, even when no loop exists in the Turner graph, posterior probability cannot be computed accurately and the error correction performance deteriorates as in a situation in which a short loop exists in the graph.

When there is a delay in message computation at the check nodes, the error correction performance deteriorates greatly. This is because the ratio of a message or messages outputted by a check node within the entire input messages that the same check node receives increases.

For instance, when there is no delay in message computation at the check nodes, the messages that the first cluster C1 receives in the second iteration are L+RC11+RC12+RC13 (refer to FIG. 8A). Here, L is the value of the input LLR. On the other hand, when there is a delay of 2 clock cycles in message computation at the check nodes, they are L+RC11 in the second iteration (refer to FIG. 8B), increasing the ratio (proportion) of RC11, i.e., the output message of the first cluster C1. Because of this, the error correction performance and decoding characteristics will deteriorate.

In order to solve the above-described problems, the invention disclosed in the present application is structured as below.

According to an aspect of the present invention there is provided a decoding device that decodes a received low density parity check code by repeating the passing of messages between a plurality of check nodes and a plurality of bit nodes corresponding to a low density parity check matrix in each iteration. The decoding device comprises means (scheduler) that varies the order of message computation at the check nodes in one of at least two iterations that have a before-and-after relationship in time and the order of message computation at the check nodes in another iteration. In the present invention, when there are N clusters (where 1 check node per cluster when the cluster size is 1) and messages are computed at check nodes with a processing delay of D, the scheduler assigns a cluster index to a cluster to be computed at the $Y^{th}$ order in an $X^{th}$ iteration as follows:

(((Y−1)+(X−1)*(N−D))% N)+1 where % represents the remainder.

In the present invention, the bit node may comprise a control unit that weights (or means for weighting) a message sent to the bit node from the check node.

In the present invention, it is controlled so that a bit node passes the same message to all check nodes connected to the same bit node and that the ratio of a message outputted by the check node within messages sent to the check node is reduced.

In the present invention, the longer ago a message is computed at the check node, the less influential it becomes.

In the present invention, the bit node may comprise a holding unit that holds a message received from the check node, multiplies the held message by a weight of a positive number smaller than 1 every time the bit node receives a message from the check node thereafter, and holds the multiplication result.

In the present invention, when the bit node receives a message for the $i^{th}$ time (where i is a positive number not less than 2) from the check node, it may compute a message to be sent to the check node based on the multiplication of a message received from the check node for the $j^{th}$ time (where j is an integer greater than or equal to 1, but less than i) by $w^{(i-j)}$ (where w is the weighted coefficient) and the message received for the $i^{th}$ time (where i is a positive number not less than 2).

According to another aspect of the present invention there is provided a decoding method wherein a received low density parity check code is decoded by repeating the passing of messages between a plurality of check nodes and a plurality of bit nodes corresponding to a low density parity check matrix in each iteration, and including a step of varying the order of message computation at the check nodes in one of at least two iterations that have a before-and-after relationship in time and the order of message computation at the check nodes in another iteration.

According to a further aspect of the present invention there is provided a computer-readable program that has a computer, which decodes a received low density parity check code by repeating the passing of messages between a plurality of check nodes and a plurality of bit nodes corresponding to a low density parity check matrix in each iteration, execute processing for varying the order of message computation at the check nodes in one of at least two iterations that have a before-and-after relationship in time and the order of message computation at the check nodes in another iteration. The program is stored in a machine-readable medium by a computer.

The meritorious effects of the present invention are summarized as follows.

According to the present invention, in an LDPC decoder to which SPA reducing the number of messages by approximating the equation for the computation of messages is applied, the decoding characteristics can be improved by varying the order of message computation in at least two iterations that have a before-and-after relationship in time and reducing the ratio of a message from a check node within messages sent to the same check node.

Further, according to the present invention, in an LDPC decoder to which SPA reducing the number of messages by approximating the equation for the computation of messages is applied, the decoding characteristics can be improved by weighting a message so that the longer ago the message is computed, the less influential it becomes.

PREFERRED EMBODIMENTS OF THE INVENTION

The present invention will be further described in detail with reference to the attached drawings. According to an preferred embodiment of the present invention, a decoding device that decodes a received LDPC code by repeating the passing of messages (reliability information) between a plurality of check nodes and a plurality of bit nodes corresponding to a check matrix H in each iteration comprises an approximating unit that approximates message computation and controls a bit node n to pass the same message $Q_n$ to all check nodes connected to the bit node n, and a scheduling nit that controls to vary the order of message computation at the check nodes in an iteration out of at least two iterations that have a before-and-after relationship in time, and the order of message computation at the check nodes in another iteration. The two iterations may be consecutive in time. The order of message computation may be switched in each iteration.

In another preferred embodiment, the present invention comprises a control unit that controls the ratio of a message $R_{mn}$ outputted by a check node m within messages passed from a bit node to the check node m to be small in addition to the aforementioned scheduling unit. The message $R_{mn}$ is weighted so that the longer ago it was computed at a check node, the less influential the message $R_{mn}$ that has already been outputted by the check node m becomes within the message Qn passed from the bit node n to the check node m. The present invention will be described with reference to embodiments hereinafter.

Embodiment

Figure 1:
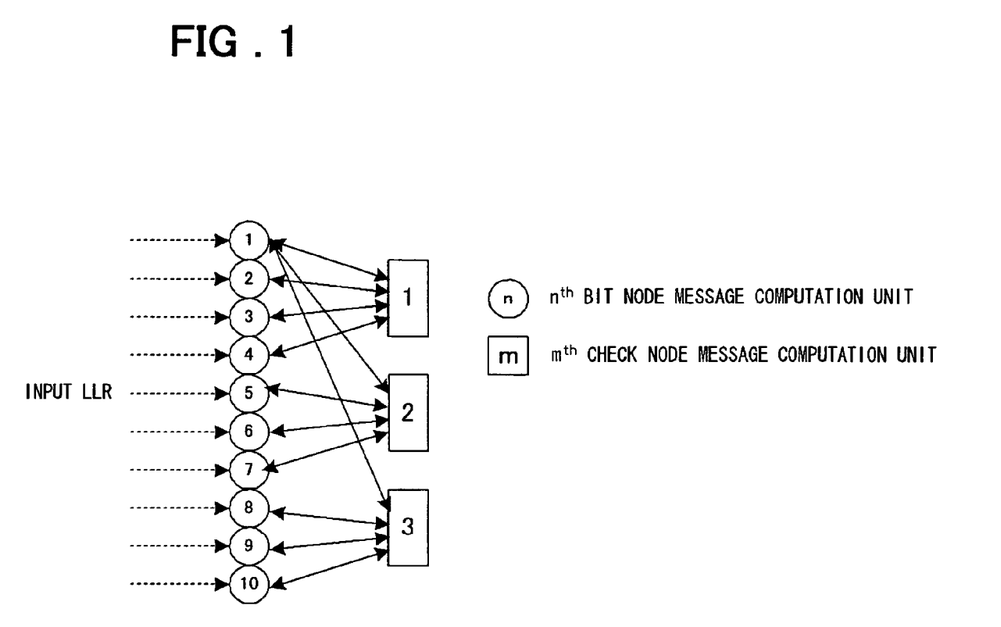
FIG. 1 is a drawing for explaining an embodiment of the present invention.

A first embodiment of the present invention will be described. FIG. 1 is a drawing for explaining the present embodiment. Corresponding to the 10×3 check matrix H of the equation (1), it comprises ten bit nodes (first to tenth bit node message computation units) and three check nodes (first to third check node message computation units). Input LLRs (Log Likelihood Ratio) supplied to the first to tenth bit node message computation units are channel LLRs.

The message $R_{mn}$ from the check node m to the bit node n is computed for each cluster, and the results are added to $Q'_n$. By this approximation, one bit node sends the same message to all the adjacent check nodes, greatly reducing registers for holding messages and interconnect paths.

In the present embodiment, the computation of messages from the bit nodes to the check node(s) is performed using the approximation by the equation (6), and a bit node outputs the same message $Q'_n(k)$ to all the check nodes connected to the bit node. Further, the equation (2) is used for the computation of the message $R_{mn}$ from the check node m to the bit node n.

FIGS. 8A and 8B show the case where the cluster size is 1 and the three check nodes correspond to the clusters C1 to C3, respectively. As shown in FIG. 8B, when the approximation by the equation (6) is used at the message computation at the check nodes and the delay in message computation is 2 clock cycles, the messages sent from the bit node 1 to the check node 1 grouped as the cluster C1 in the second iteration are L+RC11, increasing the ratio of the message RC11 computed at the check node 1 grouped as the cluster C1 in the first iteration. This will deteriorate decoding characteristics.

Therefore, the present embodiment comprises a scheduling unit (a scheduler described later) that varies the order of message computation at the check nodes in one (for instance the first iteration) of at least two iterations that have a before-and-after relationship in time and the order of message computation at the check nodes in another iteration (for instance the second iteration).

Figure 2:
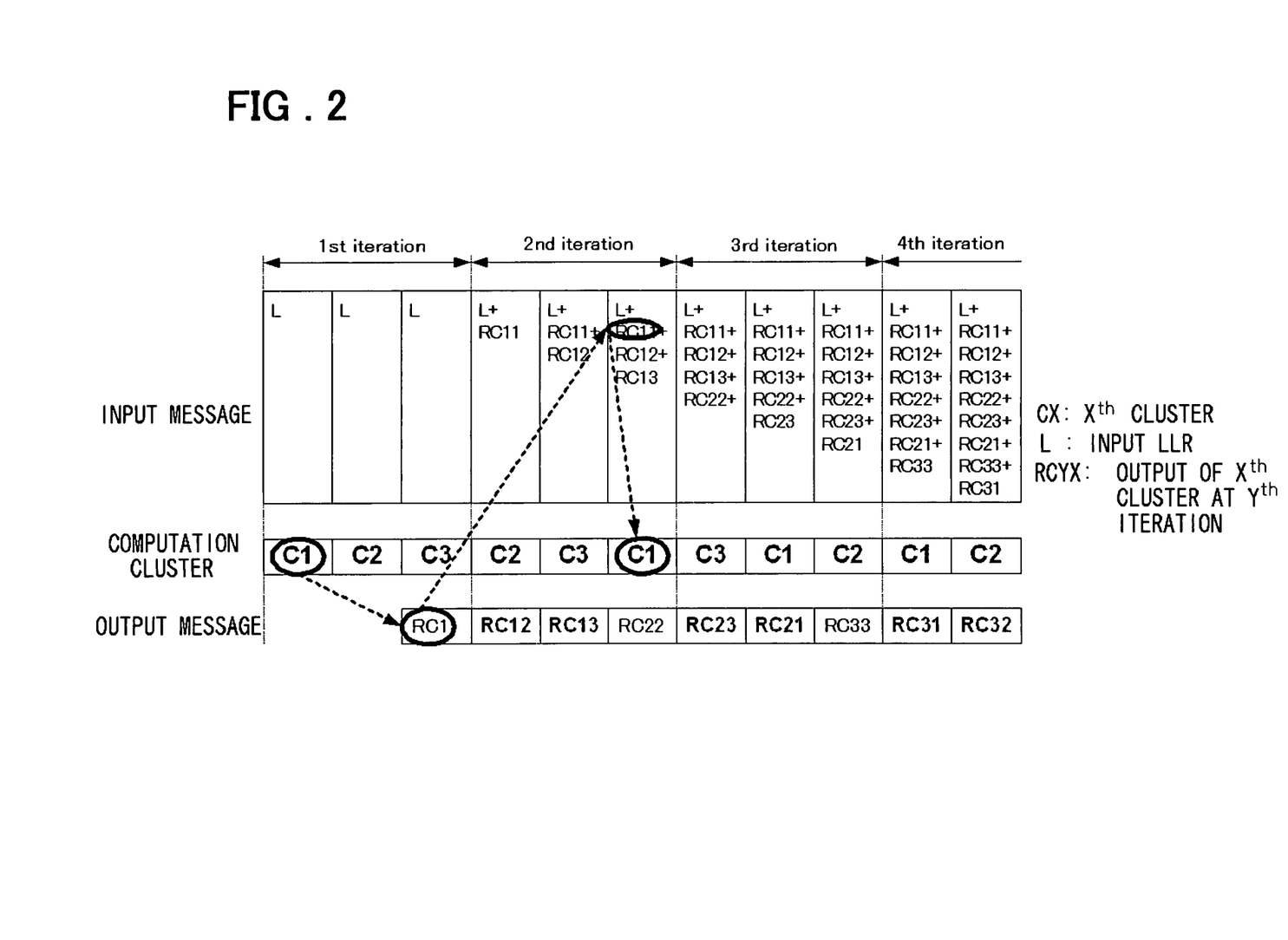
FIG. 2 is a drawing for explaining the operation of the first embodiment of the present invention.

FIG. 2 is a timing chart for explaining the operation of the first embodiment of the present invention. As the timing charts of message computation shown in FIGS. 8A and 8B, the cluster size is 1 and the three check nodes are divided into three clusters C1, C2, and C3. C1, C2, and C3 correspond to the check nodes 1, 2, and 3 respectively. As in FIG. 8B, the processing delay in message computation at the check nodes is 2 clock cycles.

As shown in FIG. 2, in the first iteration, messages are computed in the order of C1, C2 and C3. C2, C3, and C1 in the second iteration and C3, C1, and C2 in the third iteration.

With the delay of 2 clock cycles, the message RC11 of the cluster C1 in the first iteration is outputted to the bit node 1 when the message of the cluster C3 is computed. A message RC12 of the cluster C2 in the first iteration is outputted to the bit node 1, after the delay of 2 clock cycles, when the messages of the cluster C2 in the second iteration is computed. A message RC13 of the cluster C3 in the first iteration is outputted to the bit node 1, after the delay of 2 clock cycles, when the messages of the cluster C3 in the second iteration is computed.

In the second iteration, first, the cluster C2 receives messages L+RC11 computed at the bit node 1 based on the equation (6). The input messages L+RC11 do not include the message RC12 computed at the cluster C2 (the check node 2), therefore there is no short loop.

Then while still in the second iteration, messages L+RC11+RC12 are computed based on the equation (6) at the bit node 1 who has received the message RC12 from the cluster C2, and the messages L+RC11+RC12 are supplied to the cluster C3. The input messages L+RC11+RC12 do not include the message RC13 computed at the cluster C3 (the check node 3), therefore there is no short loop.

Then while still in the second iteration, messages L+RC11+RC12+RC13 are computed based on the equation (6) at the bit node 1 who has received the message RC13 from the cluster C3, and the messages L+RC11+RC12+RC13 are supplied to the cluster C1. The input messages L+RC11+RC12+RC13 include the message RC11 computed at the cluster C1 (the check node 1), however, it is merely a part of the messages L+RC11+RC12+RC13 and not a part of L+RC11 as in the case shown in FIG. 8B. Therefore its influence is reduced and decoding characteristics are improved compared to the case shown in FIG. 8B.

In the present embodiment, the order of the clusters at which messages are computed is varied in each iteration.

Generally, when N clusters are processed by a check node message computation unit with a processing delay of D, the cluster to be computed at the $Y^{th}$ order a message in an $X^{th}$ iteration can be given by an equation (7).

$$(((Y-1)+(X-1)*(N-D))\% N)+1 \qquad (7)$$

where % represents the remainder.

Next, a second embodiment of the present invention will be described. In the second embodiment of the present invention, the order of the clusters at which messages are computed is varied as in the first embodiment, and decoding characteristics are improved by weighting a message so that the longer ago the message is computed at a check node, the less influential it becomes within messages sent to the check node.

In the second embodiment of the present invention, the computation of messages from the bit nodes to the check nodes is basically performed using the approximation by the equation (6), and a bit node outputs the same message $Q'_n(k)$ (where k is discrete time) to all the check nodes connected to the bit node. The equation (3) is used for the computation of the message $R_{mn}$ from the check node m to the bit node n.

In the present embodiment, the approximation equation (6) for the computation of messages from the bit nodes to the check nodes is changed to equations (8) and (9).

$$Q'_n(k) = LLR + QS_n(k) \qquad (8)$$

$$QS_n(k) = QS_n(k-1)*w + \sum_{m' \in \mu(n)} R_{m'n} \qquad (9)$$

Note that w denotes the weighted coefficient (a positive number smaller than 1).

The bit node n holds LLR and a property $QS_n(k)$ at a time k, and sends $Q'_n(k)$, the result of adding them, to all the adjacent check nodes (refer to the equation (8)). QSn(0), the initial value of $QS_n(k)$, is 0. The property $QS_n(k)$ is updated by adding the total sum ($\Sigma R_{m'n}$) of the messages $R_{m'n}$ received this time to the multiplication of $QS_n(k-1)$ at the previous time (a time k−1) by a weight w ($QS_n(k-1)*w$). (Refer to the equation (9).

By this weighting process, the longer ago the message is computed, the less influential it becomes. Therefore, compared to the case in which the approximation equation (6) is used, the ratio of the message outputted by a check node within messages supplied to the same check node is reduced, improving the error correction performance.

In other words, in the present embodiment, the order of the message computations at the check node message computation units is varied in each iteration, and decoding characteristics are improved by weighting a message so that the longer ago the message is computed at a check node, the less influential it becomes within messages sent to the check node.

The second embodiment of the present invention will be described using the LDPC code defined by the 10×3 check matrix H of the equation (1). As in the previous embodiment, corresponding to the 10×3 check matrix H of the equation (1), it comprises ten bit nodes (first to tenth bit node message computation units) and three check nodes (first to third check node message computation units) as shown in FIG. 1. Input LLRs (Log Likelihood Ratio) supplied to the first to tenth bit node message computation units are channel LLRs.

The message $R_{mn}$ from the check node m to the bit node n is computed for each cluster, and the results are added to $Q'_n$. By this approximation, one bit node sends the same message to all the adjacent check nodes, greatly reducing registers for holding messages and interconnect paths.

At an $n^{th}$ bit node message computation unit (n is any number from 1 to 10), the equations (8) and (9) are used for the computation of messages from the bit node n to the check nodes.

An $m^{th}$ check node message computation unit (m is any number from 1 to 3) computes the message $R_{mn}$ from the check node m to the bit node n according to the equation (3).

Figure 3:
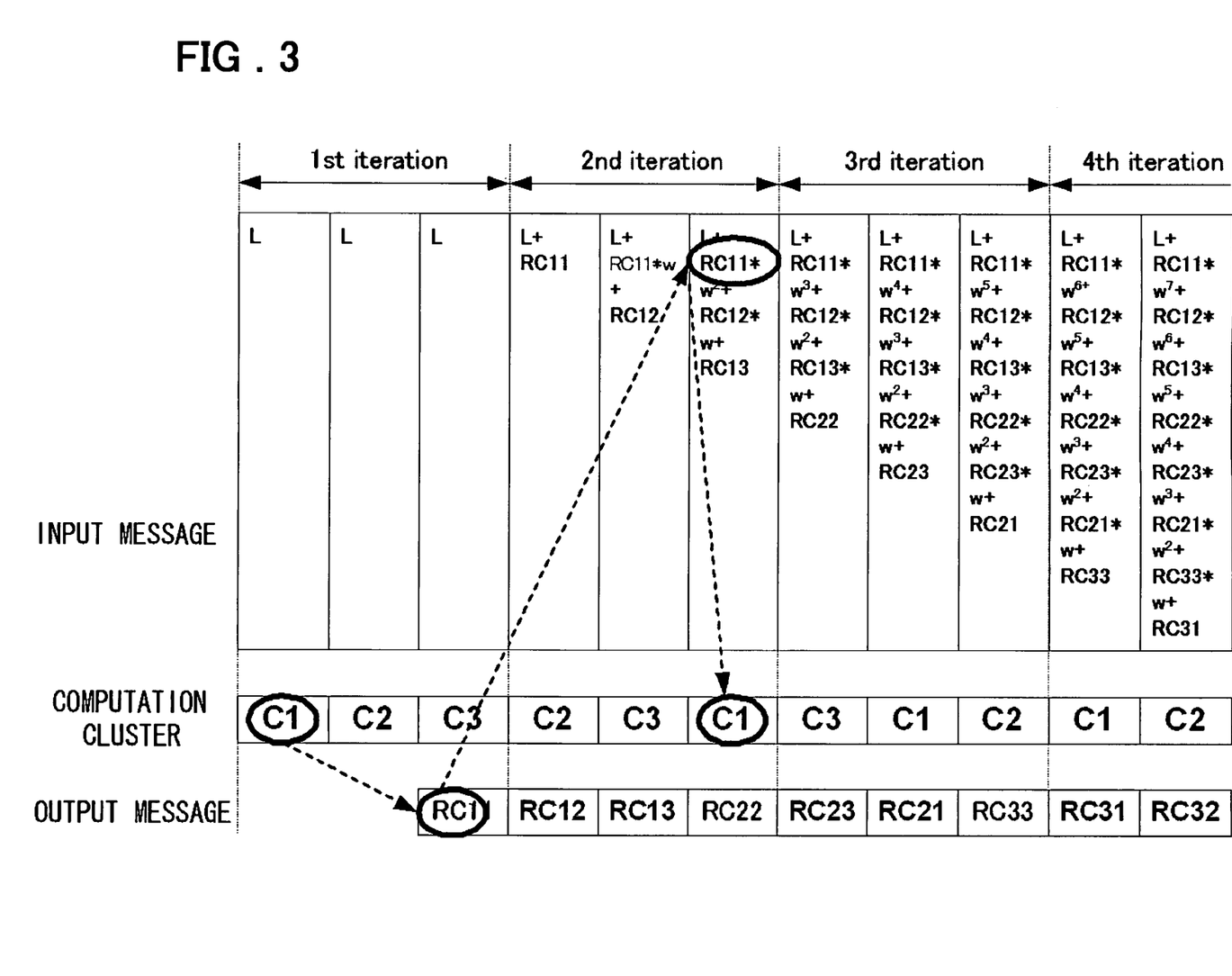
FIG. 3 is a drawing for explaining the operation of another embodiment of the present invention.

FIG. 3 is a drawing for explaining the operation timing when the cluster size is set to 1 in FIG. 1 (one check node per cluster) and the three check nodes are divided into three clusters. As in FIG. 2, the delay in message computation at the check nodes is 2 clock cycles.

As shown in FIG. 3, in the first iteration, messages are computed in the order of C1, C2 and C3. C2, C3, and C1 in the second iteration and C3, C1, and C2 in the third iteration.

With the delay of 2 clock cycles, a message RC11 of the cluster C1 in the first iteration is outputted to the bit node 1 when the message of the cluster C2 is computed. A message RC12 of the cluster C2 in the first iteration is outputted to the bit node 1, after the delay of 2 clock cycles, when the messages of the cluster C2 in the second iteration is computed. A message RC13 of the cluster C3 in the first iteration is outputted to the bit node 1, after the delay of 2 clock cycles, when the messages of the cluster C3 in the second iteration is computed.

In the second iteration, first, the cluster C2 receives messages L+RC11 computed at the bit node 1. The input messages L+RC11 do not include the message RC12 computed at the cluster C2 (the check node 2), therefore there is no short loop.

Then while still in the second iteration, messages L+RC11*w+RC12 are computed based on the equations (8) and (9) at the bit node 1 who has received the message RC12 from the cluster C2, and the messages L+RC11*w+RC12 are supplied to the cluster C3. The input messages L+RC11*w+RC12 do not include the message RC13 computed at the cluster C3 (the check node 3), therefore there is no short loop.

Then while still in the second iteration, messages L+RC11*$w^2$+RC12*w+RC13 are computed based on the equations (8) and (9) at the bit node 1 who has received the message RC13 from the cluster C3, and the messages L+RC11*$w^2$+RC12*w+RC13 are supplied to the cluster C1. The input messages L+RC11*$w^2$+RC12*w+RC13 include the message RC11 computed at the cluster C1 (the check node 1), however, it is merely a part of the messages L+RC11*$w^2$+RC12*w+RC13 and is multiplied by the square of the weighted coefficient w (RC11*$w^2$) further decreasing the ratio of the message RC11. Therefore the influence of the message RC11 within the input messages L+RC11*$w^2$+RC12*w+RC13 received by the cluster C1 (the check node 1) is subdued and decoding characteristics are greatly improved, compared to the structure shown in FIG. 8 B, in which the messages (L+RC11) are supplied to the cluster C1.

Figure 4:
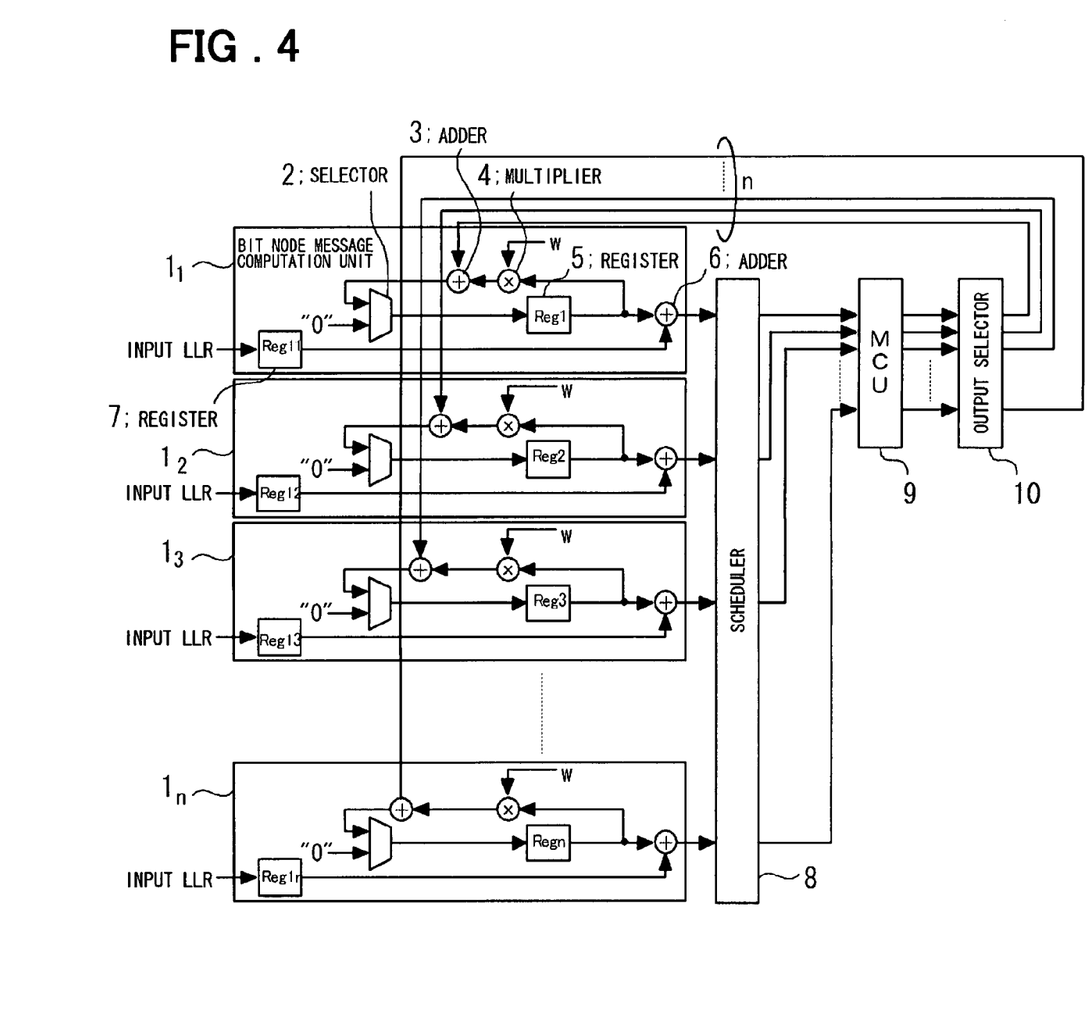
FIG. 4 is a drawing showing an embodiment of a device of the present invention.

FIG. 4 is a diagram illustrating the structure of a decoder circuit of an embodiment of the present invention. As shown in FIG. 4, the circuit comprises n bit node message computation units $1_1$ to $1_n$, a scheduler 8, an MCU 9 (Message Computation Unit: also called "check node message computation unit"), and an output selector 10. The scheduler 8 selects a check node to which the bit node message computation units $1_1$ to $1_n$ output messages. The MCU 9 is a controller that constitutes the check nodes. The output of the MCU 9 is forwarded to a bit node message computation unit selected from the bit node message computation units $1_1$ to $1_n$ via the output selector 10. The cluster size of the structure shown in FIG. 4 is 1.

The bit node message computation unit $1_1$ comprises a selector 2, an adder 3, a multiplier 4, a register 5, a register 7, and an adder 6. The register 7 holds the input LLR. The adder 6 adds the value of the register 5 (Reg1) and the input LLR (an output of the register 7). Note that all the n bit node message computation units $1_1$ to $1_n$ are structured identically.

The multiplier 4 multiplies the output of the register 5 (Reg1) by the weighted coefficient w. When a property $QS_n$(k−1) at the time k−1 is stored in the register 5, the multiplier 4 outputs $QS_n(k-1)*w$ (refer to the equation (9)).

The adder 3 adds the output of the multiplier 4 ($QS_n(k-1)*w$) and the message $R_{m'n}$ from the MCU 9, derives the property $QS_n(k)$ at this time (the time k)—refer to the equation (9)—, and updates the register 5. Note that the MCU 9 pays attention to (and the bit node n receives) only one message since the cluster size is 1 in the present embodiment. Therefore the adding operation of $\Sigma R_{m'n}$ (refer to the equation (9)) is not performed. When the cluster size is equal to or greater than 2, the adder 3 adds the addition result ($\Sigma R_{m'n}$) of multiple messages from the MCU 9 to the output of the multiplier 4 ($QS_n(k-1)*w$).

The adder 6 performs the addition LLR+$QS_n(k)$ and outputs the result as $Q'_n(k)$ (refer to the equation (8)).

The scheduler 8 switches the order of message computation at the clusters (the check nodes) in each iteration. For instance, as shown in FIGS. 2 and 3, the order is variable-controlled as follows: C1, C2, and C3 in the first iteration, C2, C3, and C1 in the second iteration, and C3, C1, and C2 in the third iteration. Further, the scheduler 8 functions as a switch for supplying messages from a bit node to all check nodes connected to the bit node. For instance, it selects a path for messages from the bit nodes to the check nodes in the message passing shown in FIG. 6.

The MCU 9 computes the message $R_{mn}$ based on the equation (3) and outputs it. The output selector 10 distributes the message from the MCU 9 to the destination bit node.

The output selector 10 selects a path for messages from the check nodes to the bit nodes, for instance, in the message passing shown in FIG. 5.

The structure shown in FIG. 3 in which the value of the weighted coefficient w is 1 (or in which the multiplier 4 is omitted) corresponds to the structure of the first embodiment of the present invention described with reference to FIG. 2. The structure in which the weighted coefficient w is 0<w<1 corresponds to the second embodiment described with reference to FIG. 3.

Referring to FIG. 3, a message outputted by the bit node message computation unit $1_1$ (the bit node 1) in the structure shown in FIG. 4 will be described. An input "0" of the selector 2 is an input for initializing the register 5 in the summing operation of the equation (9). When 0 is selected by the selector 2 and is held by the register 5, the output of the adder 6 is L, which is the value of the input LLR, and a message L is supplied to a check node.

At this time, the output of the multiplier 4 is 0. The output of the adder 3 is RC11 when it receives the message RC11 sent by the check node. Since the selector 2 selects the output of the adder 3, RC11 is stored in the register 5, the adder 6 adds the value L of the input LLR to RC11, and messages L+RC11 are outputted to the check node.

Then, RC11*w, the result of multiplying RC11, the output of the register 5, by w by the multiplier 4, is added to the message RC12 from the cluster C2 (the check node 2). The result RC11*w+RC12 is selected by the selector 2 and held by the register 5. The adder 6 outputs messages L+RC11*w+RC12. The weight accumulation process is performed similarly thereafter, and the bit node 1 supplies L+RC11*w²+RC12*w+RC13 to the check node 1 in the second iteration.

Note that the processings of the registers, the selector, the adders, and the multiplier of the bit node message unit shown in FIG. 4 may be realized by a program executed by a computer. The processings of the scheduler, the MCU, and the output selector may be performed by a computer program. This computer program is stored in a machine-readable medium, load into main memory and executed by a computer.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A decoding device decoding a received low density parity check code by repeating the passing of messages between a plurality of check nodes and a plurality of bit nodes corresponding to a low density parity check matrix in each iteration, said decoding device comprising:

a scheduler that varies the order of message computation at the check nodes in one of at least two iterations that have a before-and-after relationship in time and the order of message computation at the check nodes in another iteration.

2. The decoding device as defined in claim 1 comprising a control unit that controls a bit node to pass the same message to all check nodes connected to said a bit node.

3. The decoding device as defined in claim 1 wherein, when there are N clusters, where 1 check node per cluster when the cluster size is 1, and messages are computed at check nodes with a processing delay of D, said scheduler assigns a cluster index to a cluster to be computed at the $Y^{th}$ order in an $X^{th}$ iteration as follows:

$$((Y-1)+(X-1)*(N-D))\% N)+1,$$

where % represents the remainder.

4. The decoding device as defined in claim 1 comprising a weighting unit that weights a message sent to said bit node from said check node out of messages sent from said bit node to said check node.

5. The decoding device as defined in claim 4 comprising:
a control unit that controls a bit node to pass the same message to all check nodes connected to said a bit node, and
means for controlling said bit node to reduce the ratio of a message outputted by said check node within messages sent to said check node.

6. The decoding device as defined in claim 4 wherein the longer ago a message is computed at said check node, the less influential said message becomes.

7. The decoding device as defined in claim 4 wherein said bit node comprises a holding unit that holds a message received from said check node, multiplies said held message by a weight of a positive number smaller than 1 every time said bit node receives a message from said check node thereafter, and holds the multiplication result.

8. The decoding device as defined in claim 7 wherein upon receiving a message for the $i^{th}$ time, where i is a positive number not less than 2, from said check node, said bit node computes a message to be sent to said check node based on the multiplication of a message received from said check node for the $j^{th}$ time, where j is an integer greater than or equal to 1, but less than i, by $w^{(i-j)}$, where w is the weighted coefficient and said message received for the $i^{th}$ time, where i is a positive number not less than 2.

9. A decoding device decoding a received low density parity check code by repeating the passing of messages between a plurality of check nodes and a plurality of bit nodes corresponding to a low density parity check matrix in each iteration, said decoding device comprising:
a control unit that controls a bit node to pass the same message to all check nodes connected to said a bit node, and
means for controlling the ratio of a message that has been outputted by a check node within messages sent to the same check node as said check node to be small by varying the order of message computation at said check nodes in one of at least two iterations that have a before-and-after relationship in time and the order of message computation at said check nodes in another iteration.

10. A decoding method comprising:
decoding a received low density parity check code by repeating the passing of messages between a plurality of check nodes and a plurality of bit nodes corresponding to a low density parity check matrix in each iteration, and a varying step that varies the order of message computation at the check nodes in one of at least two iterations that have a before-and-after relationship in time and the order of message computation at the check nodes in another iteration.

11. The decoding method as defined in claim 10 wherein a bit node passes the same message to all check nodes connected to said a bit node.

12. The decoding method as defined in claim 10 wherein, when there are N clusters, where 1 check node per cluster when the cluster size is 1, and messages are computed at check nodes with a processing delay of D, a cluster index is assigned to a cluster to be computed at the $Y^{th}$ order in an $X^{th}$ iteration as follows:

$$((Y-1)+(X-1)*(N-D))\% N)+1,$$

where % represents the remainder.

13. The decoding method as defined in claim 10 comprising a step of weighting a message sent to said bit node from said check node out of messages sent from said bit node to said check node.

14. The decoding method as defined in claim 13 comprising:
a step of controlling a bit node to pass the same message to all check nodes connected to said a bit node; and
a step of controlling said bit node to reduce the ratio of a message outputted by said check node within messages sent to said check node.

15. The decoding method as defined in claim 13 wherein the longer ago a message is computed at said check node, the less influential said message becomes.

16. The decoding method as defined in claim 13 comprising a step wherein said bit node holds a message received from said check node, multiplies said held message by a weight of a positive number smaller than 1 every time said bit node receives a message from said check node thereafter, and holds the multiplication result.

17. The decoding method as defined in claim 16 wherein upon receiving a message for the $i^{th}$ time, where i is a positive number not less than 2, from said check node, said bit node computes a message to be sent to said check node based on the multiplication of a message received from said check node for the $j^{th}$ time, where j is an integer greater than or equal to 1, but less than i, by $w^{(i-j)}$, where w is the weighted coefficient and said message received for the $i^{th}$ time, where i is a positive number not less than 2.

18. A computer-readable program stored in machine-readable medium, comprising the steps of:
decoding a received low density parity check code by repeating the passing of messages between a plurality of check nodes and a plurality of bit nodes corresponding to a low density parity check matrix in each iteration; and
varying the order of message computation at the check nodes in one of at least two iterations that have a before-and-after relationship in time and the order of message computation at the check nodes in another iteration.

19. The program stored in machine-readable medium as defined in claim 18 wherein, when there are N clusters, where 1 check node per cluster when the cluster size is 1, and messages are computed at check nodes with a processing delay of D, a cluster index is assigned to a cluster to be computed at the $Y^{th}$ order in an $X^{th}$ iteration as follows:

$$(((Y-1)+(X-1)*(N-D))\% N)+1,$$

where % represents the remainder.

20. The program stored in machine-readable medium as defined in claim 18 comprising:
weighting a message sent from said check node to said bit node out of messages sent from said bit node to said check node.

21. The program stored in machine-readable medium as defined in claim 20 comprising:
controlling a bit node to pass the same message to all check nodes connected to said a bit node; and
controlling said bit node to reduce the ratio of a message outputted by said check node within messages sent to said check node.

22. The program stored in machine-readable medium as defined in claim 20 wherein the longer ago a message is computed at said check node, the less influential said message becomes.

23. The program stored in machine-readable medium as defined in claim 20 comprising:
holding, by said bit node, a message received from said check node;
multiplying said held message by a weight of a positive number smaller than 1 every time said bit node receives a message from said check node thereafter; and
holding the multiplication result.

24. The program stored in machine-readable medium as defined in claim 23 comprising:
computing, by said bit node, a message to be sent to said check node upon receiving a message for the $i^{th}$ time, where i is a positive number not less than 2, from said check node based on the multiplication of a message received from said check node for the $j^{th}$ time, where j is an integer greater than or equal to 1, but less than i, by $w^{(i-j)}$, where w is the weighted coefficient and said message received for the $i^{th}$ time, where i is a positive number not less than 2.

* * * * *